(12) United States Patent
Tong

(10) Patent No.: US 12,426,485 B2
(45) Date of Patent: Sep. 23, 2025

(54) DISPLAY PANEL AND DISPLAY DEVICE

(71) Applicant: Hubei Yangtze Industrial Innovation Center Of Advanced Display Co., Ltd., Wuhan (CN)

(72) Inventor: Xiaoyang Tong, Wuhan (CN)

(73) Assignee: Hubei Yangtze Industrial Innovation Center of Advanced Display Co., Ltd., Wuhan (CN)

( * ) Notice: Subject to any disclaimer, the term of this patent is extended or adjusted under 35 U.S.C. 154(b) by 456 days.

(21) Appl. No.: 18/091,842

(22) Filed: Dec. 30, 2022

(65) Prior Publication Data
US 2023/0140596 A1 May 4, 2023

(30) Foreign Application Priority Data
Aug. 26, 2022 (CN) .......................... 202211034299.3

(51) Int. Cl.
*H10K 59/80* (2023.01)
*H10K 59/12* (2023.01)

(52) U.S. Cl.
CPC ......... *H10K 59/8791* (2023.02); *H10K 59/12* (2023.02)

(58) Field of Classification Search
CPC . H10K 59/8791; H10K 59/12; H10K 59/8792
See application file for complete search history.

(56) References Cited

U.S. PATENT DOCUMENTS

| | | | | |
|---|---|---|---|---|
| 6,867,831 B2 * | 3/2005 | Takizawa | .......... | G02F 1/133512 349/113 |
| 2003/0147115 A1 * | 8/2003 | Takizawa | .......... | G02F 1/133512 359/263 |
| 2005/0275775 A1 * | 12/2005 | Hinata | .............. | G02F 1/133555 349/114 |
| 2006/0066766 A1 * | 3/2006 | Tanaka | ................ | G02F 1/13394 349/44 |
| 2010/0226120 A1 * | 9/2010 | Koma | ............... | G02F 1/133603 362/97.1 |
| 2010/0259827 A1 * | 10/2010 | Lee | ...................... | G02B 5/0808 359/609 |
| 2011/0031491 A1 * | 2/2011 | Yamazaki | .......... | H10D 30/6704 257/E29.296 |
| 2011/0181974 A1 * | 7/2011 | Hori | ..................... | H10K 59/878 257/E33.072 |
| 2011/0234088 A1 * | 9/2011 | Abe | ..................... | H10K 50/844 428/218 |

(Continued)

FOREIGN PATENT DOCUMENTS

| CN | 105324705 A | 2/2016 |
|---|---|---|
| CN | 114283699 A | 4/2022 |

(Continued)

*Primary Examiner* — Mohsen Ahmadi
(74) *Attorney, Agent, or Firm* — KDW Firm PLLC

(57) ABSTRACT

Embodiments of the present disclosure provide a display panel and a display device. The display panel includes multiple light-emitting elements located at the display region. The display panel also includes a light-shielding unit and a reflection adjusting unit. Along the thickness direction of the display panel, a light-shielding unit of the multiple light-shielding units at least partially overlaps a gap between two adjacent ones of the plurality of light-emitting elements. The reflection adjusting unit overlaps at least part of the light-shielding unit.

19 Claims, 10 Drawing Sheets

(56) References Cited

U.S. PATENT DOCUMENTS

| | | | |
|---|---|---|---|
| 2017/0090245 A1* | 3/2017 | Tsuchiya | H10K 59/8792 |
| 2018/0012948 A1* | 1/2018 | Lee | H10D 86/411 |
| 2018/0138458 A1* | 5/2018 | Tokuda | H10K 50/86 |
| 2019/0187523 A1* | 6/2019 | Jian | G02F 1/133512 |
| 2020/0373281 A1* | 11/2020 | Ruan | H10H 20/855 |
| 2020/0380238 A1* | 12/2020 | Zeng | G09G 3/3208 |
| 2021/0082995 A1* | 3/2021 | Ikeda | H10H 20/857 |
| 2021/0202452 A1* | 7/2021 | Kim | H10H 20/857 |
| 2021/0202621 A1* | 7/2021 | Liang | H10K 59/124 |
| 2021/0217833 A1* | 7/2021 | Yu | H10K 59/126 |
| 2022/0006062 A1* | 1/2022 | Li | H10K 50/865 |
| 2022/0069187 A1* | 3/2022 | Akimoto | H10H 20/825 |
| 2022/0131027 A1* | 4/2022 | Akimoto | H10H 20/018 |
| 2022/0149113 A1* | 5/2022 | Akimoto | H10H 20/82 |
| 2022/0238612 A1* | 7/2022 | Shi | H10K 59/80515 |
| 2022/0238760 A1* | 7/2022 | Chen | H10H 20/811 |
| 2022/0327857 A1* | 10/2022 | Kusunoki | G06V 40/50 |
| 2022/0352265 A1* | 11/2022 | Takahashi | G06F 1/1684 |
| 2022/0406881 A1* | 12/2022 | Wang | H10K 59/1315 |
| 2022/0416124 A1* | 12/2022 | Tanemura | C23C 14/06 |
| 2023/0011597 A1* | 1/2023 | Zeng | G06V 40/1318 |
| 2023/0019576 A1* | 1/2023 | Kamada | G06V 40/1318 |
| 2023/0056073 A1* | 2/2023 | Hirosawa | H10H 20/855 |
| 2023/0103995 A1* | 4/2023 | Takahashi | H10K 59/65 |
| | | | 257/40 |
| 2023/0140596 A1* | 5/2023 | Tong | H10K 59/8792 |
| | | | 257/91 |
| 2023/0217704 A1* | 7/2023 | Park | H10K 59/126 |
| | | | 257/40 |
| 2023/0371350 A1* | 11/2023 | Naganuma | H10K 59/13 |
| 2024/0006568 A1* | 1/2024 | Huo | H10H 20/855 |
| 2025/0089511 A1* | 3/2025 | Hu | H10K 59/879 |

FOREIGN PATENT DOCUMENTS

| | | |
|---|---|---|
| CN | 114335110 A | 4/2022 |
| CN | 114899212 A | 8/2022 |

* cited by examiner

DISPLAY PANEL AND DISPLAY DEVICE

CROSS-REFERENCE TO RELATED APPLICATION

This application claims priority to Chinese patent application No. 202211034299.3 filed on Aug. 26, 2022, the disclosure of which is incorporated herein by reference in its entirety.

TECHNICAL FIELD

Embodiments of the present disclosure relate to the field of display technology and, in particular, to a display panel and a display device.

BACKGROUND

With the development of the display technology, display panels are more and more widely used in products such as mobile phones, computers, tablet computers, and e-books and in meter-type display devices and control panels of smart homes.

In recent years, as display panels are equipped with more and more functions, the arrangement modes of different regions of a display panel may be different. As a result, reflectance of external ambient light is different in different regions, and thus different regions of the display panel in a non-display state are clearly demarcated.

SUMMARY

Embodiments of the present disclosure provide a display panel and a display device. By adding a reflection adjusting unit to adjust the reflectance of the display panels, the reflection differences in different areas of the display panel are thus reduced.

Embodiments of the present disclosure provide a display panel including a display region, and the display region includes multiple light-emitting elements.

The display panel further includes a light-shielding layer located on a light-emitting side of the multiple light-emitting elements. The light-shielding layer includes multiple light-shielding units, and along the thickness direction of the display panel, the light-shielding unit at least partially overlaps the gap between two adjacent light-emitting elements.

The display panel further includes a reflection adjusting unit located on a side of the light-shielding layer facing away from the light-emitting elements, and along the thickness direction of the display panel, the reflection adjusting unit overlaps at least part of the light-shielding unit.

Embodiments of the present disclosure provide a display device including the display panel described in the above-mentioned embodiments.

According to the display panel provided by embodiments of the present disclosure, a light-shielding layer on the light-emitting side of the light-emitting element helps avoid the optical crosstalk between adjacent light-emitting elements; thus, the display effect of the display panel is ensured. Meanwhile, by adding a reflection adjusting unit, the reflectance of the surface of the display panel surface is adjusted, the reflected light of the external ambient light can be prevented from influencing the normal light-emitting of the display panel, and the reflectance of different regions in the display region can be adjusted so that the display difference caused by different reflectance in different regions is avoided, and the display effect of the display panel is promoted.

BRIEF DESCRIPTION OF DRAWINGS

In order to more clearly illustrate embodiments of the present disclosure, a brief introduction to the drawings required in the description of the embodiments is described below. Apparently, the drawings are merely drawings of part, not all, of embodiments of the present disclosure to be described, and those skilled in the art may obtain other drawings based on the drawings described below on the premise that no creative work is done.

DETAILED DESCRIPTION

Figure 1:
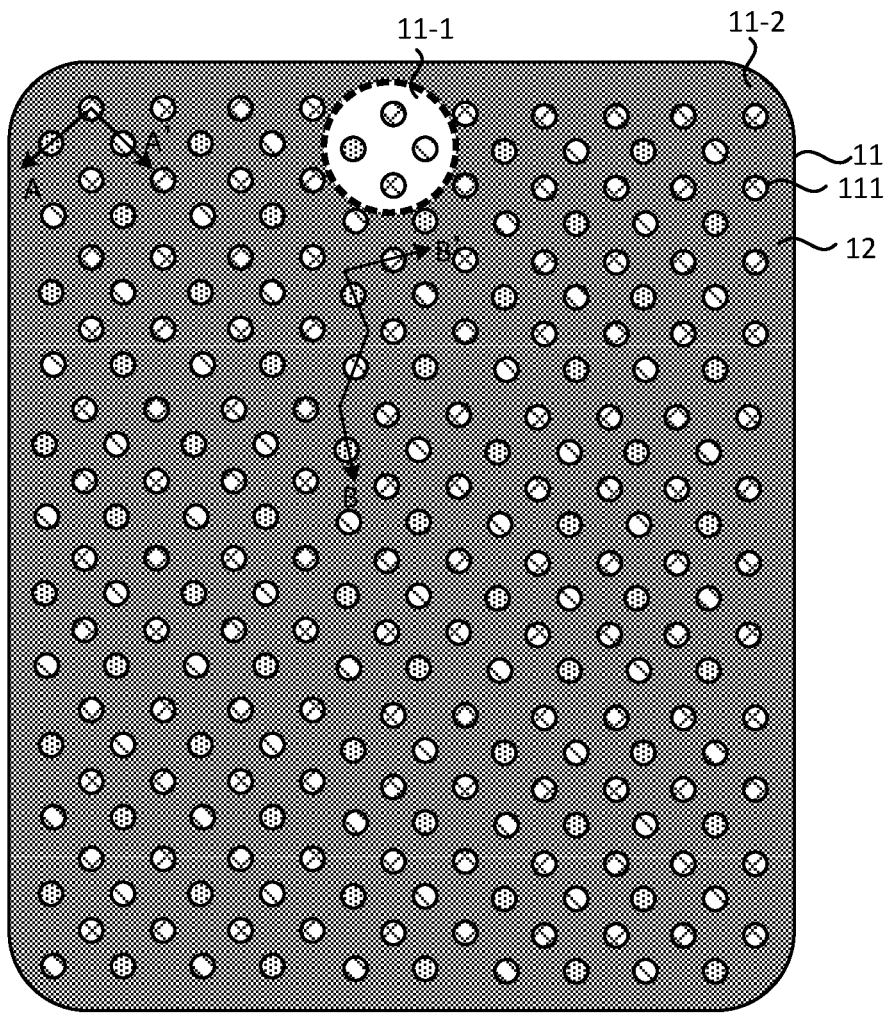
FIG. 1 is a schematic view of a display panel according to an embodiment of the present disclosure.

The present disclosure is further described hereinafter in detail in conjunction with drawings and embodiments. It is to be understood that the embodiments described herein are intended to explain the present disclosure and not to limit the present disclosure. Additionally, it is to be noted that for ease of description, only part, not all, of the structures related to the present disclosure are illustrated in the drawings.

Figure 2:
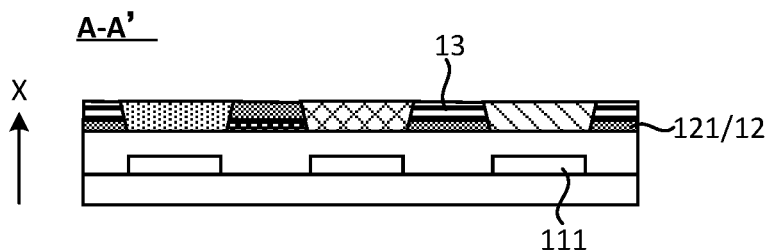
FIG. 2 is a schematic section view of the display panel provided in FIG. 1 taken along section line A-A'.

FIG. 1 is a schematic view of a display panel provided by embodiments of the present disclosure. FIG. 2 is a schematic section view of the display panel provided by FIG. 1 taken along section line A-A'. As shown in FIGS. 1 and 2, the display panel 10 according to embodiments of the present disclosure includes a display region 11. The display region 11 includes multiple light-emitting elements 111. The display panel 10 further includes a light-shielding layer 12 located on a light-emitting side of the light-emitting elements. The light-shielding layer 12 includes multiple light-shielding units 121. Along the thickness direction of the display panel 10 (the direction X as shown), a light-shielding unit 121 of the multiple light-emitting elements at least partially overlaps the gap between two adjacent light-emitting elements 111. The display panel 10 further includes a reflection adjusting unit 13 located on a side of the light-shielding layer 12 facing away from the light-emitting elements. Along the thickness direction of the display panel 10 (the direction X as shown), the reflection adjusting unit 13 overlaps at least part of the light-shielding unit 121.

In an exemplary embodiment, the display panel 10 includes the display region 11 including multiple light-emitting elements 111. The light-emitting elements 111 emit light to perform the display function of the display panel 10. In an example, the display panel 10 may further include a pixel circuit (not shown) located at the display region. The pixel circuit is electrically connected to the light-emitting elements, for providing display drive signals to the light-emitting elements, to ensure that the light-emitting elements can perform normal light-emitting display. In an example, the pixel circuit may include a thin-film transistor and a storage capacitor. For example, the pixel circuit may be a "2T1C" pixel circuit composed of two thin-film transistors and one storage capacitor or a "7T1C" pixel circuit composed of seven thin-film transistors and one storage capacitor. The pixel circuit may also include other structures, and the specific arrangement of the pixel circuit is not limited by embodiments of the present disclosure. In an example, the light-emitting element 111 may be an organic light-emitting diode, a micro light-emitting diode or a liquid crystal light-emitting element, and embodiments of the present disclosure do not limit the specific type of the light-emitting element 111.

In an exemplary embodiment, the display panel 10 provided by embodiments of the present disclosure further includes a light-shielding layer 12 located on a light-emitting side of the light-emitting elements 111. The light-shielding layer 12 includes multiple light-shielding units 121, and along the thickness direction of the display panel, the light-shielding unit 121 covers a gap between two adjacent light-emitting elements 111, that is, the light-shielding unit 121 limits the light-emitting region of the light-emitting elements 11. In this manner, the light-shielding unit 121 can avoid the optical crosstalk between adjacent light-emitting elements 111 and enhance the display effect of the display panel.

In an exemplary embodiment, the display panel 10 provided by embodiments of the present disclosure further includes a reflection adjusting unit 13 located on a side of the light-shielding layer 12 facing away from the light-emitting elements 111. Along the thickness direction of the display panel, the reflection adjusting unit 13 overlaps at least part of the light-shielding unit 121. In this manner, the reflection adjusting unit 13 can adjust the reflectance of the surface of the display panel 10, and the reflection differences in different regions of the display panel are thus reduced. For example, by reducing the reflection difference between the normal display region and the photosensitive region in the display region 11, it is ensured that the reflectance of different regions in the display region is the same or similar, that reflection degree of different regions in the display region to external ambient light is the same or similar, that the influence of the external ambient light on the light-emitting from different regions in the display region is the same or similar, and that the display balance of the display panel is good. In an example, the reflection adjusting unit 13 adjusts the reflectance of the surface of the display panel 10 to reduce reflection differences of different regions in the display region 11, blur the boundary between different regions in the display region 11, and avoid clear boundary between different display regions in a non-display state due to large reflection differences in different regions, for example, the clear boundary between a normal display region and a photosensor, thereby improving the user experience.

It is to be noted that the shape of the light-emitting element and the arrangement of the light-emitting element are not limited by embodiments of the present disclosure. FIG. 1 illustrates only one possible shape and arrangement of the light-emitting element. Other shapes and arrangements of the light-emitting element also fall within the protection scope of embodiments of the present disclosure.

It is also to be noted that in order to clearly show different structures, embodiments of the present disclosure only shows the reflection adjusting unit in the section view provided by FIG. 2, and the reflection adjusting unit in the subsequent embodiments also are only shown in the section view. That the reflection adjusting unit is not shown in the top view does not indicate that the reflection adjusting unit is not present in the drawings.

In summary, according to the display panel provided by embodiments of the present disclosure, a light-shielding layer on the light-emitting side of the light-emitting element helps avoid the optical crosstalk between adjacent light-emitting elements; thus, the display effect of the display panel is ensured. Meanwhile, by adding a reflection adjusting unit, the reflectance of the surface of the display panel surface is adjusted, the reflected light of the external ambient light can be prevented from influencing the normal light-emitting of the display panel, and the reflectance of different regions in the display region can be adjusted so that the display difference caused by different reflectance in different regions is avoided, and the display effect of the display panel is promoted.

On the basis of the above-mentioned embodiments, the reflectance of the reflection adjusting unit 13 is less than the reflectance of the light-shielding unit 121.

Exemplarily, as shown in FIG. 2, the reflection adjusting unit 13 is located on the side of the light-shielding unit 121 facing away from the light-emitting element 111, so that the reflection adjusting unit 13 replaces the light-shielding unit 121 for reflecting light shed from external environment on the display panel. According to the technical solution of embodiments of the present disclosure, the reflectance of the reflection adjusting unit 13 is set to be less than the reflectance of the light-shielding unit 121, so that the reflection to external ambient light can be reduced and the reflected light from the display panel can be reduced, that is, the interference of external ambient light on the light-emitting element 111 can be reduced, and thus the display effect of the display panel can be improved. For example, setting the reflectance of the reflection adjusting unit 13 to be less than the reflectance of the light-shielding unit 121 helps avoid a case where the content displayed on the display panel cannot be seen clearly when the intensity of external ambient light is large.

On the basis of the above-described embodiments, with continued reference to FIG. 1, in the display panel 10 provided by embodiments of the present disclosure, the display region 11 may include a first display region 11-1 and a second display region 11-2. The first display region 11-1 includes a photosensitive region, and the second display region 11-2 at least partially surrounds the first display region 11-1. Along the first direction, the reflectance of the display panel 10 gradually increases. The first direction points from the second display region 11-2 to the first display region 11-1.

In an exemplary embodiment of the present disclosure, the display region 11 includes a first display region 11-1 and a second display region 11-2, where the second display region 11-2 may be a normal display region, that is, the primary display region of display panel 10, is primarily responsible for displaying. The first display region 11-1 may be a high-transmittance display region or a transparent display region. The first display region 11-1 has both a display function and a light-transmission function, that is, the first display region 11-1 may include a photosensitive region, and the photosensitive element provided in correspondence with the photosensitive region may realize an optical recognition function through the light transmitted through the first display region 11-1. In an example, the photosensitive region may be, for example, an optical imaging region or an optical fingerprint recognition region. Correspondingly, the display panel can perform imaging function or fingerprint recognition function. In an example, since the pixel circuit for driving the light-emitting element to emit light is a main light-shielding element, in order to ensure that the transmittance of the first display region is greater than the transmittance of the second display region, the distribution density of the pixel circuits in the first display region may be set to be less than the distribution density of the pixel circuits in the second display region. In an example, the distribution density of the light-emitting elements in the first display region may be set to be less than the distribution density of the light-emitting elements in the second display region, or the same pixel circuit in the first display region may be set to drive at least two light-emitting elements, that is, the distribution density of the pixel circuits in the first display region may be reduced by "one driving multiple". Alternatively, the size of the pixel circuit in the first display region is set to be less than the size of the pixel circuit in the second display region to achieve a higher transmittance of the first display region. Embodiments of the present disclosure do not limit how the high-transparency display or transparent display is realized in the first display region.

In an exemplary embodiment, since the first display region 11-1 is a high-transmittance display region or a transparent display region, the first display region 11-1 may not be provided with a light-shielding layer 12 or the distribution density of the light-shielding units in the first display region 11-1 is less than the distribution density of the light-shielding units in the second display region 11-2. FIG. 1 is only an example in which the first display region 11-1 is not provided with a light-shielding layer 12. In this manner, the first display region 11-1 can be ensured to transmit light normally, and the display panel can be ensured to perform the optical recognition function. The inventors have found that when the first display region 11-1 is not provided with a light-shielding layer 12 or the distribution density of the light-shielding units in the first display region 11-1 is less than the distribution density of the light-shielding units in the second display region 11-2, the film structure (for example, a pixel circuit) of the display panel 10 located below the light-shielding layer 12 has a relatively strong reflection action of light shed thereon. Thus, a relatively large display difference between the first display region 11-1 and the second display region 11-2 is made, resulting in a large display difference between the first display region 11-1 and the second display region 11-2. Also, when the display panel 10 is in a non-display state, since the reflectance of the first display region 11-1 and the second display region 11-2 are different, the user can observe rather clearly the boundary between the first display region 11-1 and the second display region 11-2, affecting the user experience.

Based on this, embodiments of the present disclosure inventively arrange the reflectance of the display panel 10 gradually increasing along a direction that extends in the second display region 11-2 and points towards the first display region 11-1, so that the reflectance difference between the first display region 11-1 and the second display region 11-2 can be reduced, the boundary between the first display region 11-1 and the second display region 11-2 can be blurred, the display difference caused by the large reflectance difference between different regions and the problem that the first display region 11-1 is clearly visible in a non-display state can be avoided. In this manner, the display effect of the display panel and the user experience can be promoted.

How to realize the gradual increase of reflectance of the display panel along the first direction is described below.

Figure 3:
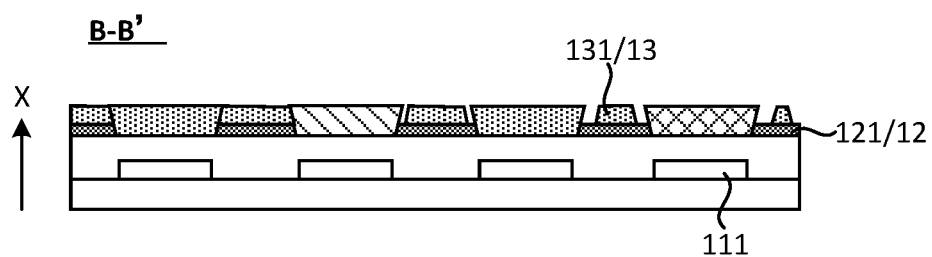
FIG. 3 is a schematic section view of the display panel provided in FIG. 1 taken along section line B-B'.
Figure 4:
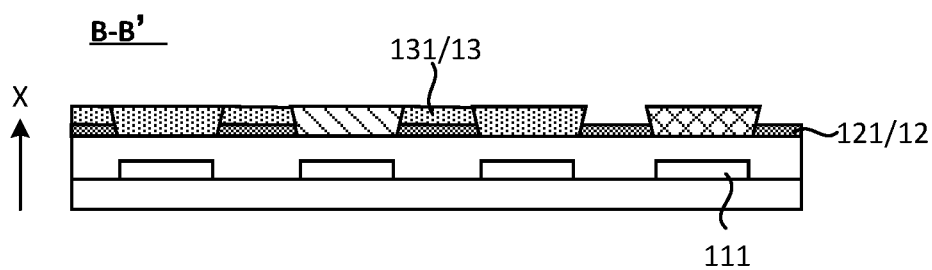
FIG. 4 is another schematic section view of the display panel provided in FIG. 1 taken along section line B-B'.
Figure 5:
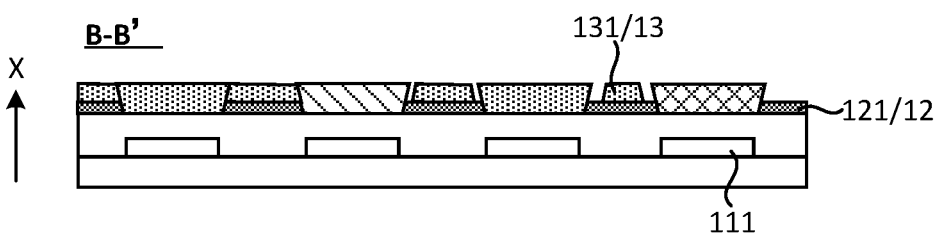
FIG. 5 is another schematic section view of the display panel provided in FIG. 1 taken along section line B-B'.

As an exemplary embodiment, FIG. 3 is a schematic section view of the display panel provided in FIG. 1 taken along section line B-B'. FIG. 4 is another schematic section view of the display panel provided in FIG. 1 taken along section line B-B'. FIG. 5 is another schematic section view of the display panel provided in FIG. 1 taken along section line B-B'. As shown in FIGS. 1, 3, 4 and 5, the reflection adjusting unit 13 includes a first color reflection adjusting unit 131. Along the first direction, the coverage area of the first color reflection adjusting unit 131 gradually decreases.

In an example, as shown in FIGS. 3 to 5, the reflection adjusting unit 13 includes a first color reflection adjusting unit 131 disposed on a side of the light-shielding unit 121 facing away from the light-emitting element 111, and the reflectance of the first color reflection adjusting unit 131 is less than the reflectance of the light-shielding unit 121. In this manner, the light flux reflected by external ambient light on the surface of the display panel 10 can be reduced, and light interference to the display panel 10 can be reduced.

In an example, along the first direction, the coverage area of the first color reflection adjusting unit 131 gradually decreases so that along the first direction, the exposed area of the light-shielding unit 121 gradually increases, and the reflectance of the display panel gradually increases. Thus, by adjusting the coverage area of the first color reflection adjusting unit to gradually decrease, the reflectance of the display panel gradually increases, the reflectance difference between the first display region and the second display region is reduced, the boundary between the first display region and the second display region is blurred, thereby improving the display effect of the display panel and the user experience.

It is to be noted that the specific color of the first color reflection adjusting unit is not limited by embodiments of the present disclosure. As a possible arrangement, the first color reflection adjusting unit 131 may be a red reflection adjusting unit.

Next, how to achieve the gradual decrease of the coverage area of the first color reflection adjusting unit is described below.

As an exemplary embodiment, with continued reference to FIGS. 1 and 3, along the first direction, the coverage area of the first color reflection adjusting unit 131 corresponding to the space between two adjacent light-emitting elements 111 gradually decreases.

In an example, as shown in FIG. 3, along the first direction, the coverage area of the first color reflection adjusting unit 131 corresponding to the space between two adjacent light-emitting elements 111 gradually decreases so that the exposed area of the light-shielding unit 121 corresponding to the space between two adjacent light-emitting elements 111 gradually increases. Since the reflectance of the light-shielding unit 121 is greater than the reflectance of the first color reflection adjusting unit 131, it is ensured that along the first direction, the coverage area of the first color reflection adjusting unit 131 gradually decreases, and the implementation manner in which the coverage area of the first color reflection adjusting unit 131 gradually decreases is simple and feasible.

As another exemplary embodiment, as shown in FIGS. 1 and 4, along the first direction, for a light-shielding unit adjacent to the first display region 11-1, the first color reflection adjusting unit 131 is not disposed on a side of the light-shielding unit 121 facing away from the light-emitting element.

In an example, as shown in FIG. 4, along the first direction, for a light-shielding unit adjacent to the first display region 11-1, the first color reflection adjusting unit 131 is not disposed on a side of the light-shielding unit 121 facing away from the light-emitting element, that is, the setting area of the light-shielding unit 121 adjacent to the first display region 11-1 is offset from the setting area of the first color reflection adjusting unit 131 so that the exposed area of the light-shielding unit 121 corresponding to the space between the two adjacent light-emitting elements 111 can be gradually increased. Since the reflectance of the light-shielding unit 121 is greater than the reflectance of the first color reflection adjusting unit 131, it is ensured that along the first direction, the coverage area of the first color reflection adjusting unit 131 gradually decreases, and the implementation manner in which the coverage area of the first color reflection adjusting unit 131 gradually decreases is simple and feasible.

It is to be noted that, along the first direction, the coverage area of the first color reflection adjusting unit 131 gradually decreases, and as shown in FIG. 3, among gaps between any two adjacent light-emitting elements 111, the coverage area of the first color reflection adjusting unit 131 corresponding to one gap which is closer to the first display region 11-1 than another gap is less than the coverage area of the first color reflection adjusting unit corresponding to the another gap. As shown in FIG. 4, two regions may exist, and the coverage area of the first color reflection adjusting unit in one of the two regions closer to the first display region 11-1 is less than the coverage area of the first color reflection adjusting unit in another of the two regions farther away from the first display region 11-1, but each region may include multiple gaps between light-emitting elements 111.

As another exemplary embodiment, with continued reference to FIGS. 1 and 5, along the first direction, the coverage area of the first color reflection adjusting unit 131 corresponding to the space between two adjacent light-emitting elements 111 gradually decreases, and along the first direction, for a light-shielding unit adjacent to the first display region 11-1, the first color reflection adjusting unit 131 is not disposed on a side of the light-shielding unit 121 facing away from the light-emitting element 111.

In an example, as shown in FIG. 3, along the first direction, the coverage area of the first color reflection adjusting unit 131 corresponding to the space between two adjacent light-emitting elements 111 gradually decreases, and along the first direction, for a light-shielding unit adjacent to the first display region 11-1, the first color reflection adjusting unit 131 is not disposed on a side of the light-shielding unit 121 facing away from the light-emitting element 111. In this manner, along the first direction, the exposed area of the light-shielding unit 121 corresponding to the space between two adjacent light-emitting elements 111 gradually increases. Since the reflectance of the light-shielding unit 121 is greater than the reflectance of the first color reflection adjusting unit 131, it is ensured that along the first direction, the coverage area of the first color reflection adjusting unit 131 gradually decreases, and the implementation manner in which the coverage area of the first color reflection adjusting unit 131 gradually decreases is simple and feasible.

In view of the above, by gradually decreasing the coverage area of the first color reflection adjusting unit along the first direction, the above-mentioned embodiment achieves a gradual increase in the reflectance of the first display panel along the first direction, the reflectance difference between the first display region and the second display region is reduced, the boundary between the first display region and the second display region is blurred, the display difference caused by the large reflectance difference between different regions and the problem that the first display region is clearly visible in a non-display state is avoided, thereby improving the display effect of the display panel and the user experience.

Next, how to realize the gradual increase of the reflectance of the display panel along the first direction from another perspective is described below.

Figure 6:
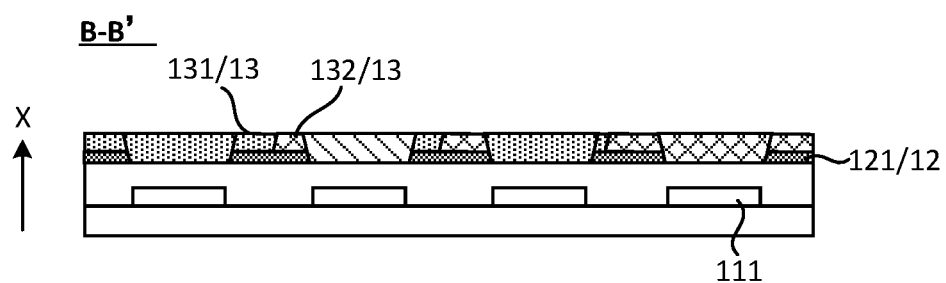
FIG. 6 is another schematic section view of the display panel provided in FIG. 1 taken along section line B-B'.
Figure 7:
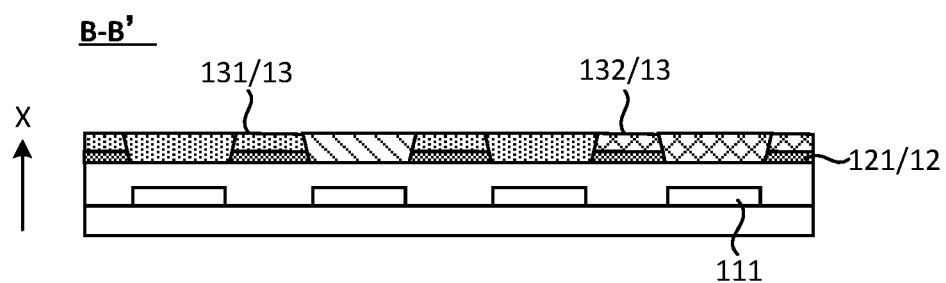
FIG. 7 is another schematic section view of the display panel provided in FIG. 1 taken along section line B-B'.

FIG. 6 is another schematic section view of the display panel provided in FIG. 1 taken along section line B-B'. FIG. 7 is another schematic section view of the display panel provided in FIG. 1 taken along section line B-B'. As shown in FIGS. 1, 6, and 7, the reflection adjusting unit 13 includes a first color reflection adjusting unit 131 and a second color reflection adjusting unit 132. The reflectance of the first color reflection adjusting unit 131 is less than the reflectance of the second color reflection adjusting unit 132. Along the thickness direction of the display panel (direction X as shown), the reflection adjusting unit 13 covers the light-shielding unit 121, and along the first direction, the coverage area of the second color reflection 132 adjusting unit gradually increases.

In an example, as shown in FIGS. 6 and 7, the reflection adjusting unit 13 covers the light-shielding unit 121 and includes the first color reflection adjusting unit 131 and the second color reflection adjusting unit 132. The reflectance of the first color reflection adjusting unit 131 and the reflectance of the second color reflection adjusting unit 132 are both less than the reflectance of the light-shielding unit 121 so that the light flux reflected by external ambient light on the surface of the display panel 10 can be reduced, and light interference to the display panel 10 can be reduced.

In an example, since the reflectance of the second color reflection adjusting unit 132 is greater than the reflectance of the first color reflection adjusting unit 131, by setting the coverage area of the second color reflection adjusting unit 132 to gradually increases along the first direction, it is ensured along the first direction, the reflectance of the display panel gradually increases, the reflectance difference between the first display region and the second display region is reduced, the boundary between the first display region and the second display region is blurred, thereby improving the display effect of the display panel and the user experience.

It is to be noted that the specific color of the first color reflection adjusting unit and the second color reflection adjusting unit are not limited by embodiments of the present disclosure. As a possible arrangement, the first color reflection adjusting unit may be a red reflection adjusting unit, and the second color reflection adjusting unit may be a green reflection adjusting unit.

Next, how to achieve a gradual increase in the coverage area of the second color reflection adjusting unit is described below.

As an exemplary embodiment, with continued reference to FIGS. 1 and 6, the coverage area of the second color reflection adjusting unit 132 corresponding to the space between two adjacent light-emitting elements 111 gradually increases.

In an example, as shown in FIG. 6, along the first direction, the coverage area of the second color reflection adjusting unit 132 corresponding to the space between two adjacent light-emitting elements 111 gradually increases, that is, the coverage area of the first color reflection adjusting unit 131 corresponding to the space between two adjacent light-emitting elements 111 gradually decreases. Since the reflectance of the second color reflection adjusting unit 132 is greater than the reflectance of the first color reflection adjusting unit 131, it is ensured that along the first direction, the coverage area of the second color reflection adjusting unit 132 gradually increases, and the implementation manner in which the coverage area of the second color reflection adjusting unit 132 gradually increases is simple and feasible.

As another exemplary embodiment, with continued reference to FIGS. 1 and 7, along the first direction, for a light-shielding unit adjacent to the second display region 11-2, the second color reflection adjusting unit 132 is not disposed on a side of the light-shielding unit 121 facing away from the light-emitting element 111.

In an example, as shown in FIG. 7, along the first direction, for a light-shielding unit adjacent to the second display region 11-2, the second color reflection adjusting unit 132 is not disposed on a side of the light-shielding unit 121 facing away from the light-emitting element 111, that is, the setting area of the light-shielding unit 121 adjacent to the second display region 11-2 is offset from the setting area of the second color reflection adjusting unit 132, that is, along the first direction, the light shielding unit 121 which is adjacent to the second display region 11-2 is not provided with a second color reflection adjusting unit 132 but only a first color reflection adjusting unit 131. In this manner, it is ensured that along the first direction, the coverage area of the second color reflection adjusting unit 132 gradually increases, and the implementation manner in which the coverage area of the second color reflection adjusting unit 132 gradually increases is simple and feasible.

It is to be noted that, along the first direction, the coverage area of the second color reflection adjusting unit 132 gradually increases, and as shown in FIG. 6, among gaps between any two adjacent light-emitting elements 111, the coverage area of the second color reflection adjusting unit corresponding to one gap which is closer to the first display region 11-1 than another gap is greater than the coverage area of the second color reflection adjusting unit corresponding to the another gap. As shown in FIG. 7, two regions may exist, and the coverage area of the second color reflection adjusting unit in one of the two regions closer to the first display region 11-1 is greater than the coverage area of the first color reflection adjusting unit in another of the two region farther away from the first display region 11-1, but each region may include multiple gaps between light-emitting elements 111.

In view of the above, by gradually increasing the coverage area of the second color reflection adjusting unit along the first direction, the above-mentioned embodiment achieves a gradual increase in the reflectance of the display panel along the first direction, the reflectance difference between the first display region and the second display region is reduced, the boundary between the first display region and the second display region is blurred, the display difference caused by the large reflectance difference between different regions and the problem that the first display region is clearly visible in a non-display state is avoided, thereby improving the display effect of the display panel and the user experience.

On the basis of the above-mentioned embodiment, as shown in FIG. 6, along the thickness direction of the display panel (direction X as shown), the reflection adjusting unit 13 covers the light-shielding unit 121. The reflection adjusting unit 13 includes a first color reflection adjusting unit 131 and a second color reflection adjusting unit 132. The reflectance of the first color reflection adjusting unit 131 is less than the reflectance of the second color reflection adjusting unit 132. The coverage area of the first color reflection adjusting unit 131 is M, and the coverage area of the second color reflection adjusting unit 132 is N. Along the first direction, $M/(M+N)$ gradually decreases.

Exemplarily, as shown in FIG. 6, along the first direction, the coverage area of the first color reflection adjusting unit 131 gradually decreases, and the coverage area of the second color reflection adjusting unit 132 gradually increases, that is, $M/(M+N)$ gradually decreases and $N/(M+N)$ gradually increases. In this manner, it is ensured that along the first direction, the reflectance of the display panel gradually increases. Moreover, it is ensured that the reflectance difference between the first display region and the second display region can be reduced, the boundary between the first display region and the second display region can be blurred, the display difference caused by the large reflectance difference between different regions and the problem that the first display region is clearly visible in a non-display state can be avoided.

The above-mentioned embodiment describes how to achieve a gradual increase in the reflectance of the display panel along the first direction by using examples of the arrangement of the first color reflection adjusting and the arrangement of the second color reflection adjusting. And how to adjust the reflectance of the display panel to gradually increase along the first direction is described next.

Figure 8:
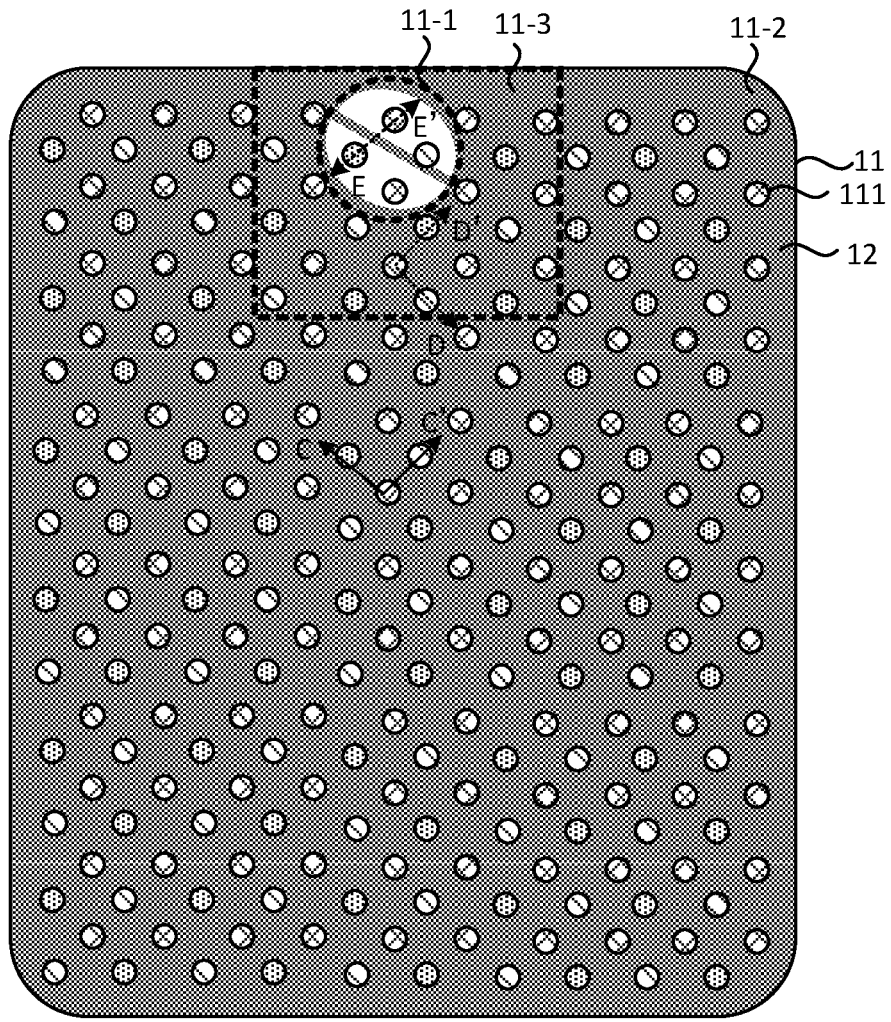
FIG. 8 is a view of schematic another display panel according to an embodiment of the present disclosure.

FIG. 8 is another schematic view of the display panel according to embodiments of the present disclosure. As shown in FIG. 8, the display panel 10 further includes a third display region 11-3. The third display region 11-3 at least partially surrounds the first display region 11-1, and the second display region 11-2 at least partially surrounds the third display region 11-3. The reflectance of the third display region 11-3 is greater than the reflectance of the second display region 11-2 and less than the reflectance of the first display region 11-2.

Exemplarily, the display region 11 of the display panel 10 may further include a third display region 11-3, which may be located between the first display region 11-1 and the second display region 11-2, that is, the third display 11-3 region at least partially surrounds the first display region 11-1 and the second display region 11-2 at least partially surrounds the third display region 11-3. The third display region 11-3 may serve as a transition region between the first display region 11-1 and the second display region 11-2. In an example, the third display region 11-3 may serve as a transition region between the reflectance of the first display region 11-1 and the reflectance of the second display region 11-2, that is, the reflectance of the third display region 11-3 is greater than the reflectance of the second display region 11-2 and less than the reflectance of the first display region 11-2, so that the reflectance of the display panel gradually increases along the first direction. In this manner, the reflectance difference between the first display region 11-1 and the second display region 11-2 can be reduced, the boundary between the first display region 11-1 and the second display region 11-2 can be blurred, the display difference caused by the large reflectance difference between different regions and the problem that the first display region 11-1 is clearly visible in a non-display state can be avoided, thereby improving the display effect of the display panel and the user experience.

In an example, the first display region 11-1 serves as a high-transmittance display region or a transparent display region, the second display region 11-2 serves as a normal display region, and the third display region 11-3 may serve as a transition region between the transmittance of the first display region 11-1 and the transmittance of the second display region 11-2. For example, the distribution density of the pixel circuits in the third display region 11-3 is set to be greater than the distribution density of the pixel circuits in the first display region 11-1, and less than the distribution density of the pixel circuits in the second display region 11-2. Or the distribution density of the light-emitting elements in the third display region 11-3 is set to be greater than the distribution density of the light-emitting elements in the first display region 11-1, and less than the distribution density of the light-emitting elements in the second display region 11-2, so as to ensure a uniform transition of the display effect between the first display region and the second display region, avoid display differences caused by different distribution densities of the pixel circuits or the light-emitting elements, and ensure that the display uniformity of the display panel is good.

Next, how to set the reflectance of the third display region to be greater than the reflectance of the second display region and less than the reflectance of the first display region is described below.

Figure 9:
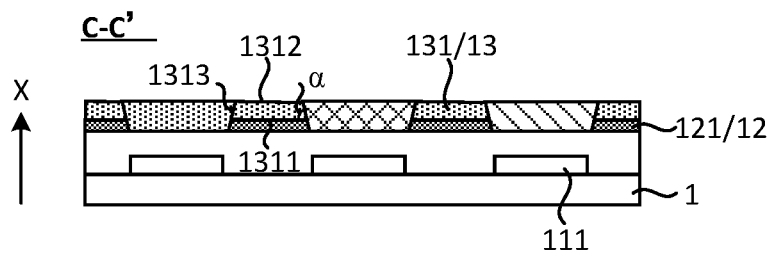
FIG. 9 is a schematic section view of the display panel provided in FIG. 8 taken along section line C-C'.
Figure 10:
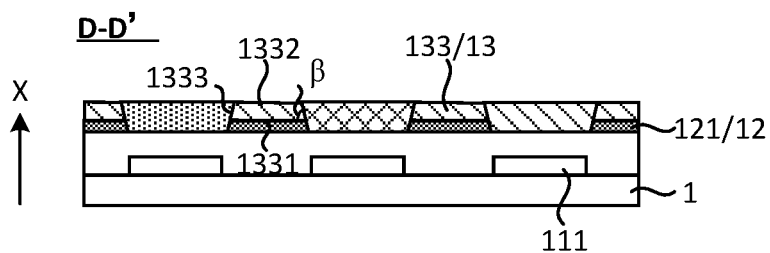
FIG. 10 is a schematic section view of the display panel provided in FIG. 8 taken along section line D-D'.
Figure 11:
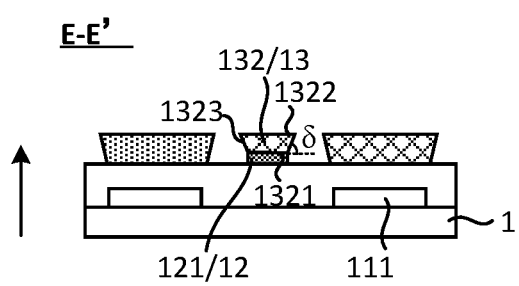
FIG. 11 is another schematic section view of the display panel provided in FIG. 8 taken along section line E-E'.

As an exemplary embodiment, FIG. 9 is another schematic section view of the display panel provided in FIG. 8 taken along section line C-C'. FIG. 10 is another schematic section view of the display panel provided in FIG. 8 taken along section line D-D'. FIG. 11 is another schematic section view of the display panel provided in FIG. 8 taken along section line E-E'. As shown in FIGS. 8 to 11, the reflection adjusting unit 13 includes a first color reflection adjusting unit 131, a second color reflection adjusting unit 132, and a third color reflection adjusting unit 133. The reflectance of the first color reflection adjusting unit 131 is less than the reflectance of the third color reflection adjusting unit 133, and the reflectance of the third color reflection adjusting unit 133 is less than the reflectance of the second color reflection adjusting unit 132. The first color reflection adjusting unit 131 covers the light-shielding unit located in the second display region 11-2, the third color reflection adjusting unit 133 covers the light-shielding unit located in the third display region 11-3, and the second color reflection adjusting unit 132 covers the light-shielding unit located in the first display region 11-1.

In an example, as shown in FIGS. 8 to 11, the reflection adjusting unit 13 includes the first color reflection adjusting unit 131, the second color reflection adjusting unit 132, and the third color reflection adjusting unit 133. The reflectance of the first color reflection adjusting unit 131, the second color reflection adjusting unit 132, and the third color reflection adjusting unit 133 are all less than the reflectance of the light-shielding unit 121, so that the light flux reflected by external ambient light on the surface of the display panel 10 can be reduced, and light interference to the display panel 10 can be reduced.

In an example, among the first color reflection adjusting unit 131, the second color reflection adjusting unit 132, and the third color reflection adjusting unit 133, the reflectance of the first color reflection adjusting unit 131 is the least, the reflectance of the second color reflection adjusting unit 131 is the largest, and the reflectance of the third color reflection adjusting unit 131 is between the two. Thus, the first color reflection adjusting unit 131 is set to cover the light-shielding unit located in the second display region 11-2, the third color reflection adjusting unit 133 is set to cover the light-shielding unit located in the third display region 11-3, and the second color reflection adjusting unit 132 is set to cover the light-shielding unit located in the first display region 11-1. In this manner, it is ensured that the reflectance of the first color reflection adjusting unit 131, the reflectance of the second color reflection adjusting unit 132, and the reflectance of the third color reflection adjusting unit 133 gradually increase, that is, along the first direction, the reflectance of the display panel is gradually increased, so that the reflectance difference between the first display region 11-1 and the second display region 11-2 can be reduced, the boundary between the first display region 11-1 and the second display region 11-2 is blurred, the display difference caused by the large reflectance difference between different regions and the problem that the first display region 11-1 is clearly visible in a non-display state can be avoided, thereby improving the display effect of the display panel and the user.

It is to be noted that the second color reflection adjusting unit 132 covers the light-shielding unit located in the first display region 11-1 when the light-shielding unit is provided in the first display region 11-1. In order to ensure that the transmittance of the first display region 11-1 is greater than the transmittance of the second display region, the distribution density of the light-shielding units in the first display region is less than the distribution density of the light-shielding units in the second display region, and/or the size of the light-shielding units in the first display region is less than the size of the light-shielding unit in the second display region.

It is also to be noted that the specific colors of the first color reflection adjusting unit, the second color reflection adjusting unit, and the third color reflection adjusting unit are not limited by embodiments of the present disclosure. As an exemplary arrangement, the first color reflection adjusting unit may be a red reflection adjusting unit, the second color reflection adjusting unit may be a green reflection adjusting unit, and the third color reflection adjusting unit may be a blue reflection adjusting unit.

Figure 12:
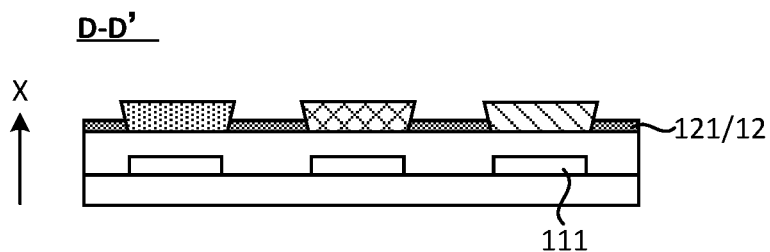
FIG. 12 is another schematic section view of the display panel provided in FIG. 8 taken along section line D-D'.
Figure 13:
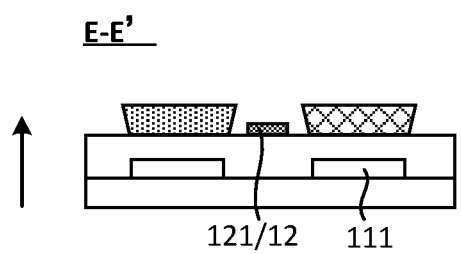
FIG. 13 is another schematic section view of the display panel provided in FIG. 8 taken along section line E-E'.

As another exemplary embodiment, FIG. 12 is another schematic section view of the display panel provided in FIG. 8 taken along section line D-D'. FIG. 13 is another schematic section view of the display panel provided in FIG. 8 taken along section line E-E'. As shown in FIGS. 8, 9, 12, and 13, the reflection adjusting unit 13 includes a first color reflection adjusting unit 131. The reflectance of the first color reflection adjusting unit 131 is less than the reflectance of the light-shielding unit 121. The first color reflection adjusting unit 131 covers the light-shielding unit 121 located in the second display region 11-2. Along the thickness direction of the display panel (direction X as shown), the light-shielding unit 121 located in the third display panel 11-3 at most partially overlaps the reflection adjusting unit 13.

In an example, as shown in FIGS. 8, 9, 12, and 13, the reflection adjusting unit 13 at least includes a first color reflection adjusting unit 131. The reflectance of the first color reflection adjusting unit 131 is less than the reflectance of the light-shielding unit 121, and the first reflection adjusting unit 131 covers the light-shielding unit 121 located in the second display region 11-2. In this manner, the light flux reflected by external ambient light on the surface of the second display region 11-2 can be reduced, and light interference to the second display region 11-2 can be reduced.

In an example, as shown in FIGS. 8, 9, 12, and 13, the first color reflection adjusting unit 131 covers the light-shielding unit 121 located in the second display region 11-2 so that it is ensured that the second display region 11-2 has a smaller reflectance. Meanwhile, along the thickness direction (direction X as shown) of the display panel, the light-shielding unit 121 located in the third display region 11-3 at most partially overlaps the reflection adjusting unit 13, that is, the third display region 11-3 is partially provided with the reflection adjusting unit or is provided no reflection adjusting unit. FIG. 12 illustrates an example that the third display region 11-3 is provided with no reflection adjusting unit 13. At this time, the reflectance of the third display region 11-3 must be greater than the reflectance of the second display region 11-2. At the same time, the first display region 11-1 is provided with no light shielding unit, or the distribution density of the light shielding units in the first display region 11-1 is less than the distribution density of the light shielding units in the second display region 11-2 and in the third display region 11-3. Therefore, whether or not the first display region 11-1 is provided with reflection adjusting units (in FIG. 13, the first display region is provided with no reflection adjusting unit), more light is transmitted through the first display region 11-1 and is reflected by the reflection structure (for example, a pixel circuit) in the first display region 11-1. Therefore, the reflectance of the first display region 11-1 is greater than the reflectance of the third display region 11-3. In this manner, it is ensured that the reflectance of the first color reflection adjusting unit 131, the reflectance of the second color reflection adjusting unit 132, and the reflectance of the third color reflection adjusting unit 133 gradually increase, that is, along the first direction, the reflectance of the display panel gradually increases, so that the reflectance difference between the first display region 11-1 and the second display region 11-2 can be reduced, the boundary between the first display region 11-1 and the second display region 11-2 is blurred, the display difference caused by the large reflectance difference between different regions and the problem that the first display region 11-1 is clearly visible in a non-display state can be avoided, thereby improving the display effect of the display panel and the user experience.

Figure 14:
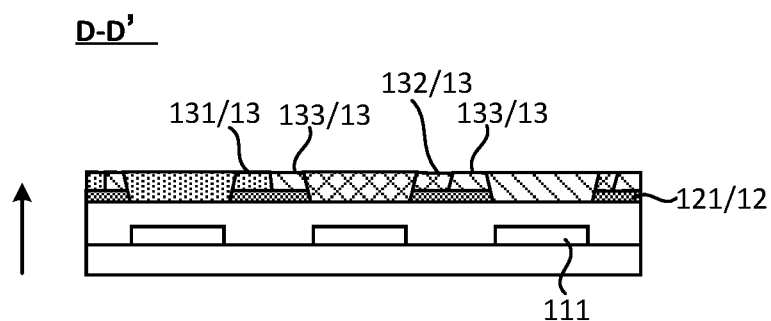
FIG. 14 is another schematic section view of the display panel provided in FIG. 8 taken along section line D-D'.

As an exemplary embodiment, FIG. 14 is another schematic section view of the display panel provided in FIG. 8 taken along section line D-D'. As shown in FIGS. 8 and 14, the reflection adjusting unit 13 includes a first color reflection adjusting unit 131, a second color reflection adjusting unit 132, and a third color reflection adjusting unit 133. The reflectance of the first color reflection adjusting unit 131 is less than the reflectance of the third color reflection adjusting unit 133, and the reflectance of the third color reflection adjusting unit 133 is less than the reflectance of the second color reflection adjusting unit 132. The first color reflection adjusting unit 131 and the third color reflection adjusting unit 133 cover the light-shielding unit located in the third display region 11-3 which is adjacent to the second display region 11-2. The second color reflection adjusting unit 132 and the third color reflection adjusting unit 133 cover the light-shielding unit 121 located in the third display region 11-2 which is adjacent to the first display region 11-1.

In an example, as shown in FIGS. 8 and 14, the reflection adjusting unit 13 includes the first color reflection adjusting unit 131, the second color reflection adjusting unit 132, and the third color reflection adjusting unit 133. Since the reflectance of the first color reflection adjusting unit 131, the second color reflection adjusting unit 132, and the third color reflection adjusting unit 133 are all less than the reflectance of the light-shielding unit 121, and the first reflection adjusting unit 131, the second color reflection adjusting unit 132, and the third color reflection adjusting unit 133 all cover the light-shielding unit 121 located in the third display region 11-3, it is ensured that the light flux reflected by external ambient light on the surface of the third display region 11-3 can be reduced, thereby reducing light interference to the third display region 11-3.

In an example, since the reflectance of the first color reflection adjusting unit 131 is less than the reflectance of the third color reflection adjusting unit 133, and the reflectance of the third color reflection adjusting unit 133 is less than the reflectance of the second color reflection adjusting unit 132, the first color reflection adjusting unit 131 and the third color reflection adjusting unit 133 are set to cover the light-shielding unit 121 located in the third display region 11-3 which is adjacent to the second display region 11-2, and that the second color reflection adjusting unit 132 and the third color reflection adjusting unit 133 cover the light-shielding unit 121 located in the third display region 11-3 which is adjacent to the first display region 11-1. In this manner, it is ensured that the reflectance of the third display region 11-3 gradually increase along the first direction, that is, the reflectance of the third display region 11-3 adjacent to the second display region 11-2 is smaller and is close to the reflectance of the second display region 11-2, and the reflectance of a side of the third display region 11-3 adjacent to the first display region 11-1 is greater and is close to the reflectance of the first display region 11-1. Thus, it is ensured that the reflectance of the display panel gradually increases along the first direction so that the reflectance difference between the first display region 11-1 and the second display region 11-2 can be reduced, the boundary between the first display region 11-1 and the second display region 11-2 can be blurred, the display difference caused by the large reflectance difference between different regions and the problem that the first display region 11-1 is clearly visible in a non-display state can be avoided, thereby improving the display effect of the display panel and the user experience.

It is to be noted that the above-mentioned embodiment is described in terms of an example that the reflectance of the third display region gradually changes, that is, the reflectance adjacent to the second display region is smaller, and the reflectance adjacent to the first display region is greater. It is to be understood that it is also possible to realize a gradual increase of the third display region along the first direction by setting the coverage area of the first color reflection unit in the third display region to gradually decrease along the first direction (the specific implementation methods can be referred to the above-mentioned embodiments), and/or the coverage area of the second color reflection unit in the third display region gradually increases along the first direction (the specific implementation methods can be referred to the above-mentioned embodiments). In this manner, it is ensured that the reflectance of the second display region, the third display region and the first display region gradually increase, that is, the reflectance of the display panel gradually increases along the first direction, so that the reflectance difference between the first display region and the second display region can be reduced, the boundary between the first display region and the second display region can be blurred, thereby improving the display effect of the display panel and the user experience are promoted.

In summary, the above embodiments provide a third display region between the first display region and second display region and set the reflectance of the third display region in a range between the reflectance of the first display region and the reflectance of the second display region, that is, the reflectance of the third display region is less than the reflectance of the first display region and greater than the reflectance of the second display region, it is ensured that along the first direction, the reflectance of the display panel gradually increases, the reflectance difference between the first display region and the second display region is reduced, the boundary between the first display region and the second display region is blurred, and thus the display effect of the display panel and the user experience are improved. In an example, the reflectance of the third display region is set to be less than the reflectance of the first display region and greater than the reflectance of the second display region. The reflectance of the third display region may be set to remain unchanged as described in the above-mentioned embodiments, or the reflectance of the third display region may be set to gradually change as described in the above-mentioned embodiments, that is, the reflectance of the third display region gradually increases along the first direction. The above-mentioned various embodiments can ensure that the reflectance of the display panel gradually increases along the first direction.

Figure 15:
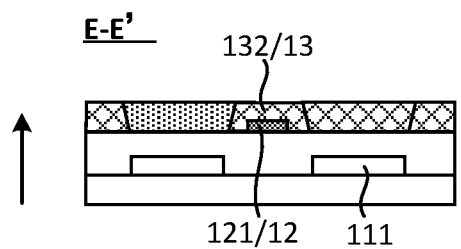
FIG. 15 is another schematic section view of the display panel provided in FIG. 8 taken along section line E-E'.

On the basis of the above-mentioned embodiment, FIG. 15 is another schematic section view of the display panel provided in FIG. 8 taken along section line E-E'. As shown in FIGS. 8 and 15, the reflection adjusting unit 13 includes a first color reflection adjusting unit 131 (not shown in figures), a second color reflection adjusting unit 132, and a third color reflection adjusting unit 133 (not shown in figures). The reflectance of the first color reflection adjusting unit 131 is less than the reflectance of the third color reflection adjusting unit 133, and the reflectance of the third color reflection adjusting unit 133 is less than the reflectance of the second color reflection adjusting unit 132. The second color reflection adjusting unit 132 covers the first display region.

In an example, the second color reflection adjusting unit 132 may be a green reflection adjusting unit. Since the photosensitive element (e.g., a fingerprint recognition element) provided in correspondence to the photosensitive region is sensitive to green light, the second color reflection adjusting unit 132 can be set to cover the first display region, that is, the second color reflection adjusting unit 132 covers the photosensitive area so that it is ensured that when light transmitted through the photosensitive area is shed on the photosensitive element, the photosensitive element has high sensitivity.

In an example, since the reflectance of the second color reflection adjusting unit 132 is less than the reflectance of the light-shielding unit, whether or not the light-shielding unit is provided for the first display region, by setting that the second color reflection adjusting unit 132 covers the first display region, the reflectance of the first display region can be reduced, the reflectance difference between the first display region and the other display region can be reduced, the boundary between the first display region and the second display region can be blurred, thereby improving the display effect of the display panel and the user experience.

Figure 16:
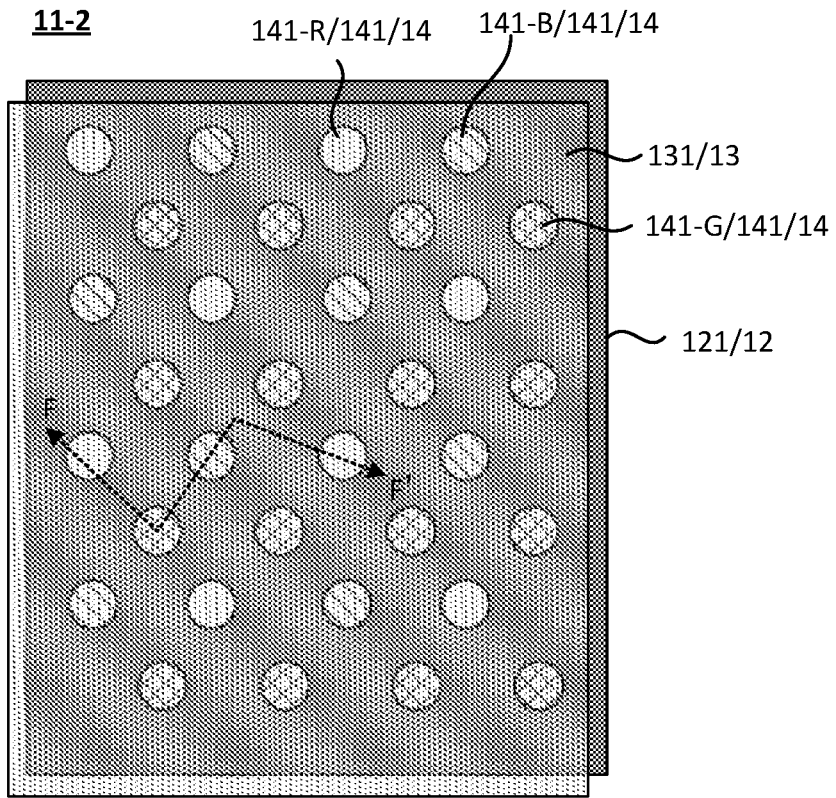
FIG. 16 is a schematic view of a second display region according to an embodiment of the present disclosure.
Figure 17:
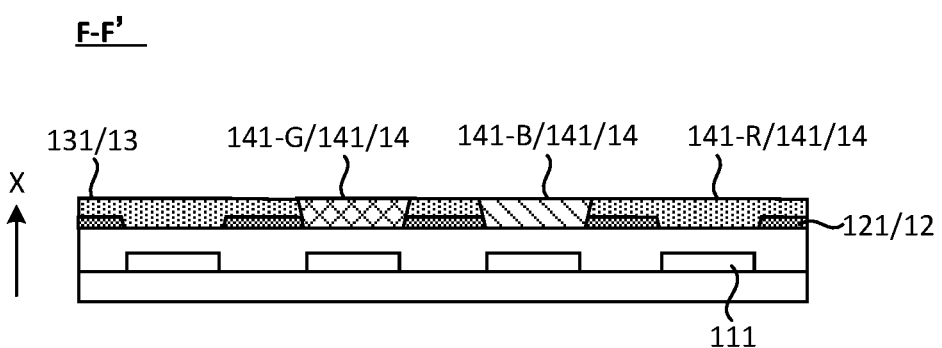
FIG. 17 is a schematic view of the second display region provided in FIG. 16 taken along section line F-F'.
Figure 18:
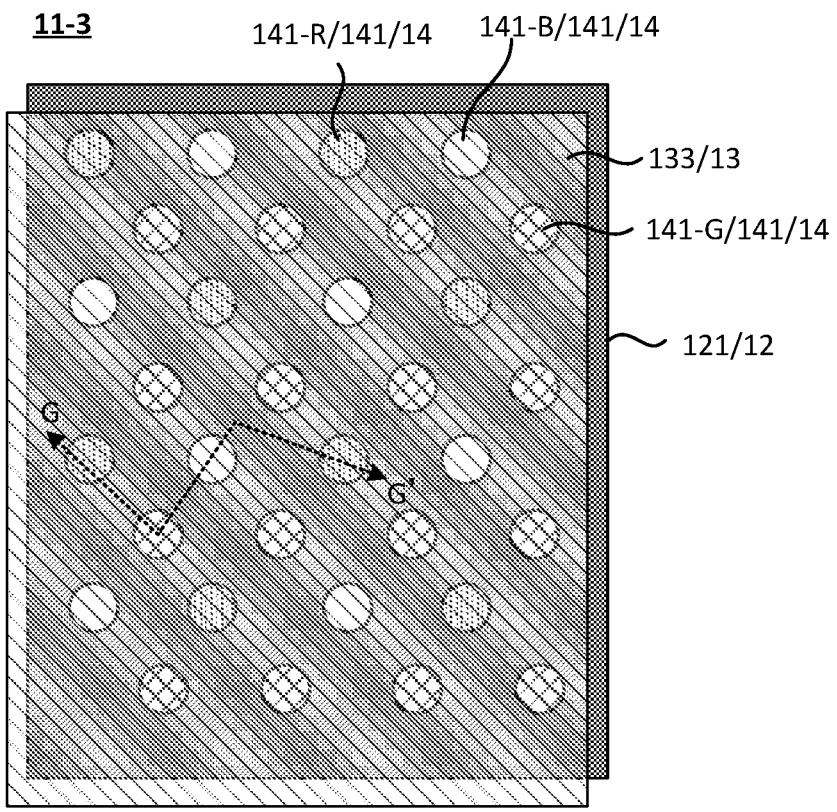
FIG. 18 is a schematic view of a third display region according to an embodiment of the present disclosure.
Figure 19:
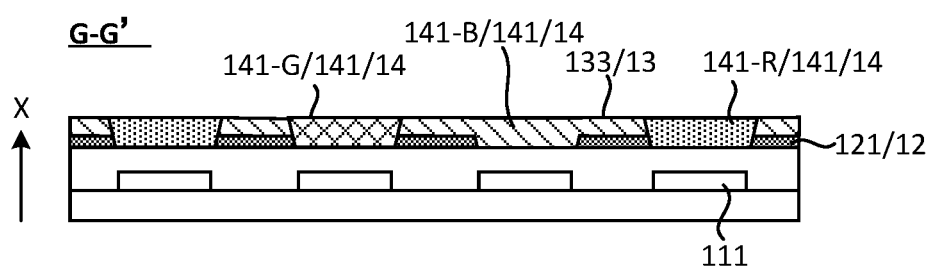
FIG. 19 is a schematic section view of a third display region provided in FIG. 18 taken along section line G-G'.
Figure 20:
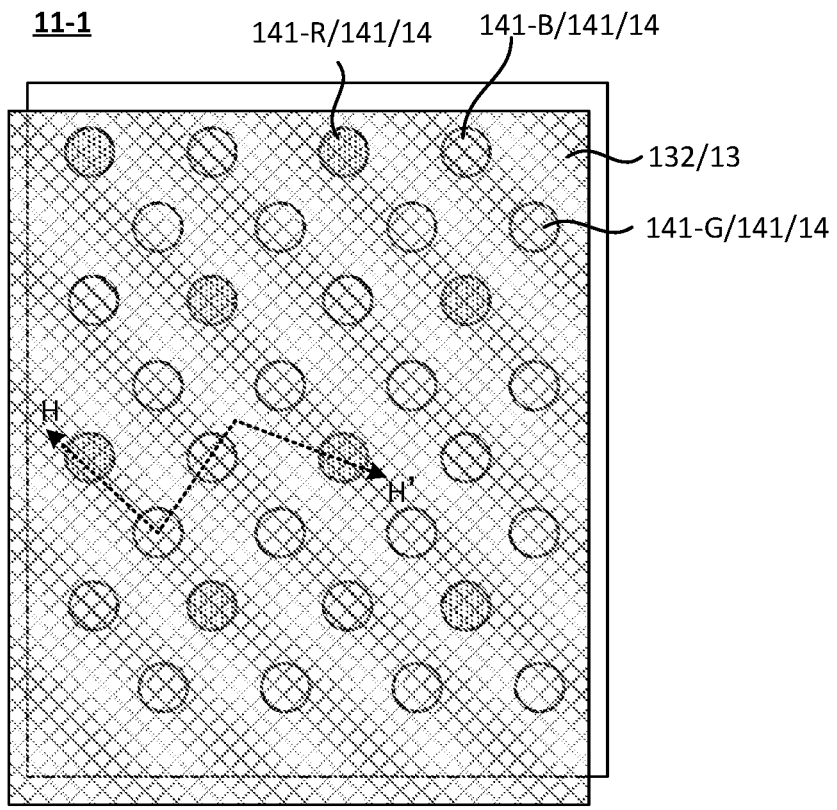
FIG. 20 is a schematic view of a first display region according to an embodiment of the present disclosure.
Figure 21:
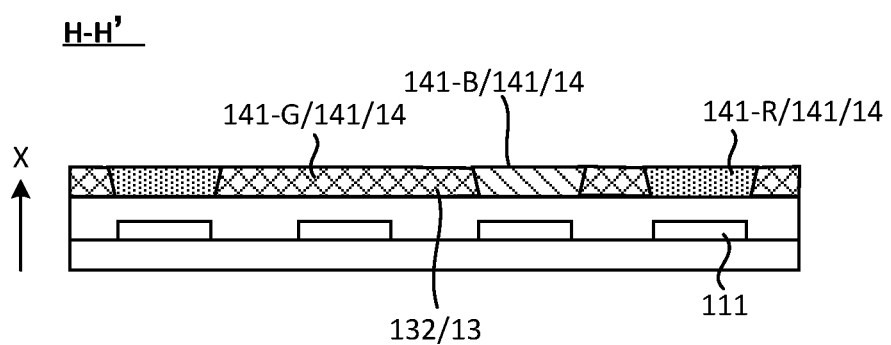
FIG. 21 is a schematic section view of the first display region provided in FIG. 20 taken along section line H-H'.

On the basis of the above-mentioned embodiment, FIG. 16 is a schematic view of a second display panel provided by embodiments of the present disclosure. FIG. 17 is a schematic section view of the display panel provided by FIG. 16 taken along section line F-F'. FIG. 18 is a schematic view of a third display panel provided by embodiments of the present disclosure. FIG. 19 is a schematic section view of the display panel provided by FIG. 18 taken along section line G-G'. FIG. 20 is a schematic view of a first display panel provided by embodiments of the present disclosure. FIG. 21 is a schematic section view of the display panel provided by FIG. 20 taken along section line H-H'. As shown in FIGS. 16 to 21, the display panel also includes a color filter layer 14 located on the light-emitting side of the light-emitting elements 111. The color filter layer 14 includes multiple color filter units 141. Along the thickness direction of the display panel (direction X as shown), the region defined by the color filter unit 141 at least partially overlaps the region defined by the light-shielding unit 121. The reflection adjusting unit 13 and the color filter units 141 are disposed in the same layer.

In an example, the display panel provided by embodiments of the present disclosure may further include a color filter layer 14 located on the light-emitting side of the light-emitting element 111. The color filter layer 14 includes multiple color filter units 141, such as red color filter units 141-R, green color filter units 141-G, and blue color filter units 141-B. Along the thickness direction of the display panel, the color filter units 141 at least partially overlap the region defined by the light-shielding unit 121, that is, the region defined by the color filter unit 141 at least partially overlaps the region defined by the light-emitting unit 121, so that the color filter units 141 of different colors can perform color filter on light emitted from the light-emitting elements 111 to perform the color display function of the display panel.

In an example, the display panel in the related art is generally provided with a polarizer on the light-emitting side of the light-emitting element to absorb external ambient light, so as to increase the proportion of the light emitted from the display panel itself, thereby realizing normal display of the display panel. However, since the polarizer also absorbs the normal light emitted from the display panel, and the polarizer has a large thickness and is not easy to bend, the provision of the polarizer reduces the normal light emission of the display panel, and causes the display panel to have a large thickness and cannot be bent or curved display. According to the technical solution of embodiments of the present disclosure, by providing a color filter layer and a light-shielding layer on the light-emitting side of the light-emitting element 111, the external ambient light is filtered or absorbed by the color filter layer and the light-shielding layer, the light shed on the display panel inside can be reduced, that is, the reflection of the external ambient light by the reflective layer (for example, a pixel circuit or other metal reflective layers) in the display panel inside can be reduced, the reflection of the display panel to external ambient light is reduced, and the proportion of light emitted from the display panel itself is increased, thereby improving the display effect of the display panel. Therefore, the light-shielding layer and the color filter layer can replace the polarizers, and the light-shielding layer and the color filter layer have a small thickness and are easily bent. Therefore, by providing the color filter layer and the light-shielding layer on the light-emitting side of the light-emitting element in embodiments of the present disclosure, it is ensured that the interference of external ambient light on the normal light-emitting of the display panel can be reduced, and that the overall thickness of the display panel is small, and the bending or curve display panel can be easily realized.

In an example, since the color filter unit 141 is provided with a small reflectance, the reflection adjusting unit 13 and the color filter unit 141 can be disposed in the same layer, that is, the reflection adjusting unit 13 and the color filter unit 141 are made by using the same material and the same technique. In this manner, on one hand, it is ensured that the reflection adjusting unit 13 is provided in a simple manner. On the other hand, the reflection adjusting unit 13 and the color filter unit 141 are disposed in the same layer can ensure a simple structure of the film of the display panel, thereby facilitating the thin design of the display panel.

In an example, the display panel provided by embodiments of the present disclosure may further include an encapsulation layer (not shown in figures). The encapsulation layer is disposed between the light-emitting element and the color filter layer and used for packaging protection of the light-emitting element to prevent moisture or oxygen from entering the light emitting element and causing erosion to the light emitting element, so as to ensure the normal operation of the light-emitting element. In an example, the encapsulation layer may be a thin film encapsulation layer, such as TFE, such that the color filter layer forms a "CF0T" structure over the thin film encapsulation layer.

In an example, as shown in FIGS. 16 and 17, in the second display region 11-2, the first color reflection adjusting unit 131 may be disposed in the same layer as the red color filter unit 141-R. As shown in FIGS. 18 and 19, in the third display region 11-3, the third color reflection adjusting unit 133 may be disposed in the same layer as the blue color filter unit 141-B. As shown in FIGS. 20 and 21, in the first display region 11-1, the second color reflection adjusting unit 132 may be disposed in the same layer as the green color filter unit 141-G. On one hand, it is ensured that the arrangement of the reflection adjusting unit 13 is simple, and on the other hand, it is ensured that the reflectance of the display panel gradually increases along the first direction by combining the reflection characteristics of the color filter units 141 in different colors.

It is to be noted that FIGS. 20 and 21 are described with reference to an example that the first display region 11-1 is not provided with a light-shielding unit. Further, in order to show different configurations, in FIGS. 16, 18, and 20, the reflection adjusting unit and the light-shielding unit or the substrate are provided in a misalignment manner. But in the existing display panel, the reflection adjusting unit and the light-shielding unit or the substrate are provided in a non-misalignment manner.

On the basis of the above-mentioned embodiments, with continued reference to FIGS. 8, 9, 10, and 11, the reflection adjusting unit 13 includes a first color reflection adjusting unit 131, a second color reflection adjusting unit 132, and a third color reflection adjusting unit 133. The reflectance of the first color reflection adjusting unit 131 is less than the reflectance of the third color reflection adjusting unit 133, and the reflectance of the third color reflection adjusting unit 133 is less than the reflectance of the second color reflection adjusting unit 132. The first color reflection adjusting unit 131 includes a first adjusting surface 1311 facing the light-emitting element 111 and a second adjusting surface 1312 facing away from a side of the light-emitting element 111. The second color reflection adjusting unit 132 includes a third adjusting surface 1321 facing the light-emitting element 111 and a fourth adjusting surface 1322 facing away from a side of the light-emitting element 111. The third color reflection adjusting unit 133 includes a fifth adjusting surface 1331 facing the light-emitting element 111 and a sixth adjusting surface 1332 facing away from a side of the light-emitting element 111. Along the thickness direction of the display panel (direction X as shown), the first adjusting surface 1311 covers the second adjusting surface 1312, the fourth adjusting surface 1322 covers the third adjusting surface 1321, and the fifth adjusting surface 1331 covers the sixth adjusting surface 1332.

Exemplarily, as shown in FIG. 9, the first color reflection adjusting unit 131 includes a first adjusting surface 1311 facing the light-emitting element 111 and a second adjusting surface 1312 facing away from a side of the light-emitting element 111. Along the thickness direction of display panel (direction X as shown), the first adjusting surface 1311 covers the second adjusting surface 1312, that is, the first color reflection adjusting unit 131 has a structure of approximate "regular trapezoid", ensuring that the manufacturing technique of the first color reflection adjusting unit 131 is simple and the structure is highly feasible. As shown in FIG. 10, the third color reflection adjusting unit 133 includes a fifth adjusting surface 1331 facing the light-emitting element 111 and a sixth adjusting surface 1332 facing away from a side of the light-emitting element 111. The fifth adjusting surface 1331 covers the sixth adjusting surface 1332 along the thickness direction of display panel (direction X as shown), that is, the third color reflection adjusting unit 133 has a structure of approximate "regular trapezoid", so as to ensure that the manufacturing technique of the first color reflection adjusting unit 131 is simple and the structure is highly feasible. As shown in FIG. 11, the second color reflection adjusting unit 132 includes a third adjusting surface 1321 facing the light-emitting element 111 and a fourth adjusting surface 1322 facing away from a side of the light-emitting element 111. Along the thickness direction (direction X as shown), the fourth adjusting surface 1322 covers the third adjusting surface 1321, that is, the second color reflection adjusting unit 132 has a structure of approximate "inverted trapezoid". The shape of the second color reflection adjusting unit 132 matches the shape of the color filter units that are in contact therewith. In this manner, the design freedom of the second color reflection adjusting units is large and at the same time the light filtering function can perform normally.

On the basis of the above-mentioned embodiments, as shown in FIGS. 9, 10, and 11, the first color reflection adjusting unit 131 further includes a first lateral surface 1313 connecting the first adjusting surface 1311 and the second adjusting surface 1312. The second color reflection adjusting unit 132 further includes a second lateral surface 1323 connecting the third adjusting surface 1321 and the fourth adjusting surface 1322. The third color reflection adjusting unit 133 further includes a third lateral surface 1333 connecting the fifth adjusting surface 1331 and the sixth adjusting surface 1332. The included angle α between a tangent plane of any point in the first lateral surface 1313 and the plane in which the substrate 1 is located satisfies 40°≤α≤70°. The included angle β between a tangent plane of any point in the second lateral surface 1323 and the plane in which the substrate 1 is located satisfies 40≤β≤70°. The included angle δ between a tangent plane of any point in the third lateral surface 1333 and the plane in which the substrate 1 is located satisfies 40°≤δ≤70°.

In an example, as shown in FIG. 9, the first color reflection adjusting unit 131 further includes a first lateral surface 1313 connecting the first adjusting surface 1311 and the second adjusting surface 1312. The included angle a between a tangent plane of any point in the first lateral surface 1313 and the plane in which the substrate 1 is located satisfies 40°≤α≤70°, that is, the taper angle of the first color reflection adjusting unit 131 is provided between 40° to 70° to ensure that the arrangement of the first color reflection adjusting unit 131 is simple and matches the manufacturing technique of the first color reflection adjusting unit 131, thereby ensuring that the manufacturing technique of the first color reflection adjusting unit 131 is simple. As shown in FIG. 10, the third color reflection adjusting unit 133 further includes a third lateral surface 1333 connecting the fifth adjusting surface 1331 and the sixth adjusting surface 1332. The included angle δ between a tangent plane of any point in the third lateral surface 1333 and the plane in which the substrate 1 is located satisfies 40°≤δ≤70°, that is, the taper angle of the third color reflection adjusting unit 133 is provided between 40° to 70° to ensure that the arrangement of the third color reflection adjusting unit 131 is simple and matches the manufacturing technique of the third color reflection adjusting unit 133, thereby ensuring that the manufacturing technique of the third color reflection adjusting unit 133 is simple. As shown in FIG. 11, the second color reflection adjusting unit 132 further includes a second lateral surface 1323 connecting the third adjusting surface 1321 and the fourth adjusting surface 1322. The included angle β between a tangent plane of any point in the second lateral surface 1323 and the plane in which the substrate 1 is located satisfies 40°≤β≤70°, that is, the taper angle of the second color reflection adjusting unit 132 is provided between 40° to 70° to ensure that the arrangement of the second color reflection adjusting unit 132 is simple and matches the manufacturing technique of the second color reflection adjusting unit 132, thereby ensuring that the manufacturing technique of the second color reflection adjusting unit 132 is simple.

Figure 22:
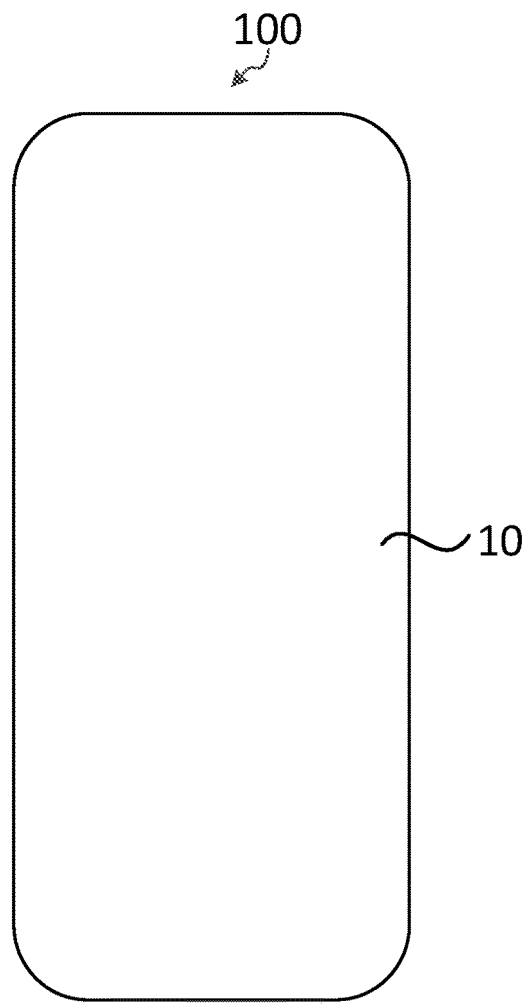
FIG. 22 is a schematic view of a display device according to an embodiment of the present disclosure.

Based on the same inventive concept, embodiments of the present disclosure further provide a display device, and FIG. 22 is a schematic view of a display device provided by embodiments of the present disclosure. As shown in FIG. 22, the display device 100 includes the display panel 10 described in any one of the above-described embodiments. Therefore, the display device 100 provided by embodiments of the present disclosure has the corresponding advantages in the above-described embodiments, and details are not described herein. For example, the display device 100 may be a mobile phone, a computer, a smart wearable device (for example, a smart watch), an in-vehicle display device, or the like electronic device, which is not limited by embodiments of the present disclosure.

Figure 23:
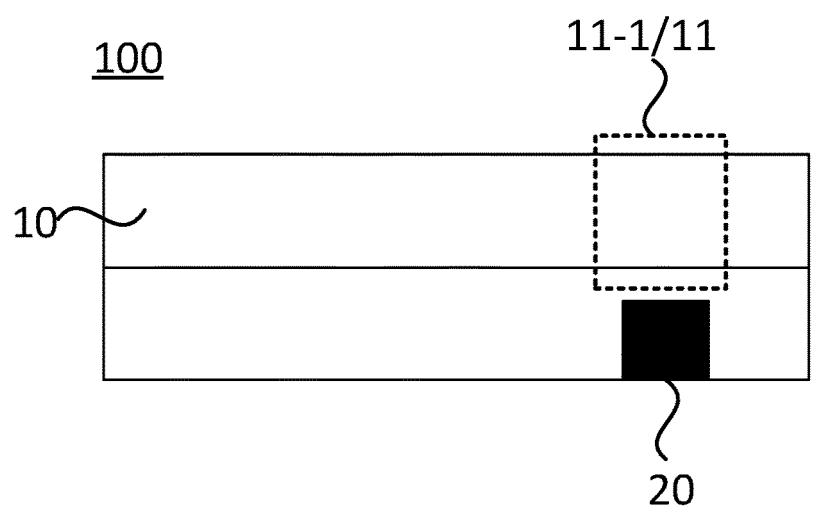
FIG. 23 is a schematic section view of a display device according to an embodiment of the present disclosure.

FIG. 23 is a schematic section view of a display device provided by embodiments of the present disclosure. As shown in FIGS. 22 and 23, in an exemplary embodiment, the display panel provided by embodiments of the present disclosure includes a display region 11, and the display region includes a first display region 11-1. The display device further includes a photosensitive unit 20 provided corresponding to the first display region 11-1.

The photosensitive unit 20 may include any photosensitive elements such as a camera, an infrared sensor, and the like. By setting the photosensitive unit 20 corresponding to the first display region 11-1, and setting the distribution density of the pixel circuit in the first display region 11-1 to be less than the distribution density of the pixel circuit in the normal display region, and/or setting the area proportion of the pixel circuit in the first display region 11-1 to be less than the area proportion of the pixel circuit in the normal display region, the light transmissive effect of the first display region 11-1 is improved to ensure that the photosensitive unit 20 can receive light normally and works normally.

It is to be noted that the preceding are only exemplary embodiments of the present disclosure and technical principles used therein. It is to be understood by those skilled in the art that the present disclosure is not limited to the embodiments described herein. Those skilled in the art can make various apparent modifications, adaptations, and substitutions without departing from the scope of the present disclosure. Therefore, while the present disclosure has been described in detail through the preceding embodiments, the present disclosure is not limited to the preceding embodiments and may include more other equivalent embodiments without departing from the concept of the present disclosure. The scope of the present disclosure is determined by the scope of the appended claims.

What is claimed is:

1. A display panel, comprising a display region, a light-shielding layer, and a reflection adjusting unit, wherein
   the display region comprises a plurality of light-emitting elements;
   the light-shielding layer is located on a light-emitting side of the plurality of light-emitting elements, the light-shielding layer comprises a plurality of light-shielding units, and along a thickness direction of the display panel, a light-shielding unit of the plurality of light-shielding units at least partially overlaps a gap between two adjacent ones of the plurality of light-emitting elements;
   the reflection adjusting unit is located on a side of the light-shielding layer facing away from the plurality of light-emitting elements, and along the thickness direction of the display panel, the reflection adjusting unit overlaps at least part of the light-shielding unit of the plurality of light-shielding units; and
   a color filter layer located on the light-emitting side of the plurality of light-emitting elements, wherein the color filter layer comprises a plurality of color filter units, and along the thickness direction of the display panel, a region defined by a color filter unit of the plurality of color filter units at least partially overlaps a region defined by the light-shielding unit; and the reflection adjusting unit and the plurality of color filter units are disposed in a same layer.

2. The display panel according to claim 1, wherein a reflectance of the reflection adjusting unit is less than a reflectance of the light-shielding unit.

3. The display panel according to claim 1, wherein the display region comprises a first display region and a second display region, wherein the first display region comprises a photosensitive region, and the second display region at least partially surrounds the first display region; and along the first direction, a reflectance of the display panel gradually increases, wherein the first direction points from the second display region to the first display region.

4. The display panel according to claim 3, wherein the reflection adjusting unit comprises a first color reflection adjusting unit; and along the first direction, a coverage area of the first color reflection adjusting unit gradually decreases.

5. The display panel according to claim 4, wherein along the first direction, a coverage area of the first color reflection adjusting unit corresponding to a space between two adjacent ones of the plurality of light-emitting elements gradually decreases.

6. The display panel according to claim 4, wherein along the first direction, for a light-shielding unit adjacent to the first display region, the first color reflection adjusting unit is not disposed on a side of the light-shielding unit facing away from a light-emitting element of the plurality of light-emitting elements.

7. The display panel according to claim 3, wherein the reflection adjusting unit comprises a first color reflection adjusting unit and a second color reflection adjusting unit, wherein a reflectance of the first color reflection adjusting unit is less than a reflectance of the second color reflection adjusting unit; and along the thickness direction of the display panel, the reflection adjusting unit covers the light-shielding unit, and along the first direction, a coverage area of the second color reflection adjusting unit gradually increases.

8. The display panel according to claim 7, wherein along the first direction, a coverage area of the second color reflection adjusting unit corresponding to a space between two adjacent ones of the plurality of light-emitting elements gradually increases.

9. The display panel according to claim 7, wherein along the first direction, for a light-shielding unit adjacent to the second display region, the second color reflection adjusting unit is not disposed on a side of the light-shielding unit facing away from a light-emitting element of the plurality of light-emitting elements.

10. The display panel according to claim 3, wherein along the thickness direction of the display panel, the reflection adjusting unit covers the light-shielding unit;

the reflection adjusting unit includes a first color reflection adjusting unit and a second color reflection adjusting unit, wherein a reflectance of the first color reflection adjusting unit is less than a reflectance of the second color reflection adjusting unit;

a coverage area of the first color reflection adjusting unit is M, and a coverage area of the second color reflection adjusting unit is N; and along the first direction, M/(M+N) gradually decreases.

11. The display panel according to claim 3, wherein the display panel further comprises a third display region, wherein the third display region at least partially surrounds the first display region, and the second display region at least partially surrounds the third display region; and a reflectance of the third display region is greater than a reflectance of the second display region and less than a reflectance of the first display region.

12. The display panel according to claim 11, wherein the reflection adjusting unit comprises a first color reflection adjusting unit, a second color reflection adjusting unit, and a third color reflection adjusting unit, wherein a reflectance of the first color reflection adjusting unit is less than a reflectance of the third color reflection adjusting unit, and the reflectance of the third color reflection adjusting unit is less than a reflectance of the second color reflection adjusting unit; and the first color reflection adjusting unit covers a light-shielding unit located in the second display region, the third color reflection adjusting unit covers a light-shielding unit located in the third display region, and the second color reflection adjusting unit covers a light-shielding unit located in the first display region.

13. The display panel according to claim 11, wherein the reflection adjusting unit comprises a first color reflection adjusting unit; and the first color reflection adjusting unit covers a light-shielding unit located in the second display region, and along the thickness direction of the display panel, a light-shielding unit located in the third display region at most partially overlaps the reflection adjusting unit.

14. The display panel according to claim 11, wherein the reflection adjusting unit comprises a first color reflection adjusting unit, a second color reflection adjusting unit, and a third color reflection adjusting unit, wherein a reflectance of the first color reflection adjusting unit is less than a reflectance of the third color reflection adjusting unit, and the reflectance of the third color reflection adjusting unit is less than a reflectance of the second color reflection adjusting unit; and the first color reflection adjusting unit and the third color reflection adjusting unit cover a light-shielding unit located in the third display region and adjacent to the second display region; and the second color reflection adjusting unit and the third color reflection adjusting unit cover a light-shielding unit located in the third display region and adjacent to the first display region.

15. The display panel according to claim 3, wherein the reflection adjusting unit comprises a first color reflection adjusting unit, a second color reflection adjusting unit, and a third color reflection adjusting unit, wherein a reflectance of the first color reflection adjusting unit is less than a reflectance of the third color reflection adjusting unit, and the reflectance of the third color reflection adjusting unit is less than a reflectance of the second color reflection adjusting unit; and the second color reflection adjusting unit covers the first display region.

16. The display panel according to claim 1, wherein the reflection adjusting unit comprises a first color reflection adjusting unit, a second color reflection adjusting unit, and a third color reflection adjusting unit, wherein a reflectance of the first color reflection adjusting unit is less than a reflectance of the third color reflection adjusting unit, and the reflectance of the third color reflection adjusting unit is less than a reflectance of the second color reflection adjusting unit; and the first color reflection adjusting unit comprises a first adjusting surface facing a light-emitting element of the plurality of light-emitting elements and a second adjusting surface facing away from the light-emitting element, the second color reflection adjusting unit comprises a third adjusting surface facing a light-emitting element of the plurality of light-emitting elements and a fourth adjusting surface facing away from the light-emitting element, and the third color reflection adjusting unit comprises a fifth adjusting surface facing a light-emitting element of the plurality of light-emitting elements and a sixth adjusting surface facing away from the light-emitting element, wherein along the thickness direction of the display panel, the first adjusting surface covers the second adjusting surface, the fourth adjusting surface covers the third adjusting surface, and the fifth adjusting surface covers the sixth adjusting surface.

17. The display panel according to claim 16, wherein the first color reflection adjusting unit further comprises a first lateral surface connecting the first adjusting surface and the second adjusting surface, the second color reflection adjusting unit further comprises a second lateral surface connecting the third adjusting surface and the fourth adjusting surface, and the third color reflection adjusting unit further comprises a third lateral surface connecting the fifth adjusting surface and the sixth adjusting surface, wherein an included angle α between a tangent plane of any point in the first lateral surface and a plane in which a substrate is located satisfies $40° \leq \alpha \leq 70°$;

an included angle β between a tangent plane of any point in the second lateral surface and the plane in which the substrate is located satisfies $40° \beta \leq 70°$; and an included angle δ between a tangent plane of any point in the third lateral surface and the plane in which the substrate is located satisfies $40° \leq \delta \leq 70°$.

18. A display device, comprising a display panel, wherein the display panel comprise a display region, a light-shielding layer, and a reflection adjusting unit, wherein the display region comprises a plurality of light-emitting elements;

the light-shielding layer is located on a light-emitting side of the plurality of light-emitting elements, the light-shielding layer comprises a plurality of light-shielding units, and along a thickness direction of the display panel, a light-shielding unit of the plurality of light-shielding units at least partially overlaps a gap between two adjacent ones of the plurality of light-emitting elements;

the reflection adjusting unit is located on a side of the light-shielding layer facing away from the plurality of light-emitting elements, and along the thickness direction of the display panel, the reflection adjusting unit overlaps at least part of the light-shielding unit of the plurality of light-shielding units; and a color filter layer located on the light-emitting side of the plurality of light-emitting elements, wherein the color filter layer comprises a plurality of color filter units, and along the thickness direction of the display panel, a region defined by a color filter unit of the plurality of color filter units at least partially overlaps a region defined by the light-shielding unit; and the reflection adjusting unit and the plurality of color filter units are disposed in a same layer.

19. The display device according to claim 18, wherein the display region comprises a first display region; and the display device further comprises a photosensitive unit, wherein the photosensitive unit is disposed at a position corresponding to a position of the first display region.

* * * * *